United States Patent
Tanaka et al.

(10) Patent No.: US 10,446,709 B2
(45) Date of Patent: Oct. 15, 2019

(54) OPTICAL SENSOR

(71) Applicant: NITTO DENKO CORPORATION, Ibaraki-shi, Osaka (JP)

(72) Inventors: Naoyuki Tanaka, Osaka (JP); Yasuto Ishimaru, Osaka (JP); Yuichi Tsujita, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/315,892

(22) PCT Filed: Jun. 2, 2015

(86) PCT No.: PCT/JP2015/065866
§ 371 (c)(1),
(2) Date: Dec. 2, 2016

(87) PCT Pub. No.: WO2015/194360
PCT Pub. Date: Dec. 23, 2015

(65) Prior Publication Data
US 2017/0133544 A1    May 11, 2017

(30) Foreign Application Priority Data

Jun. 16, 2014 (JP) .................. 2014-123270

(51) Int. Cl.
H01L 31/167 (2006.01)
H01L 31/0232 (2014.01)
(Continued)

(52) U.S. Cl.
CPC .............. *H01L 31/167* (2013.01); *G02B 6/00* (2013.01); *G02B 6/12* (2013.01); *H01L 25/167* (2013.01);
(Continued)

(58) Field of Classification Search
CPC ..... H01L 31/167; H01L 31/16; H01L 25/167; H01L 33/507; H01L 31/02322; G02B 6/12; G02B 6/00
See application file for complete search history.

(56) References Cited

U.S. PATENT DOCUMENTS 4,599,711 A * 7/1986 Cuomo ................ H04R 23/008
                                               250/227.21
5,266,797 A * 11/1993 Zuefferey .......... G01D 5/34715
                                               250/231.14
(Continued)

FOREIGN PATENT DOCUMENTS

EP       2 124 263 A2    11/2009
JP       59-99464 U1      7/1984
(Continued)

OTHER PUBLICATIONS

Office Action dated Jan. 16, 2018, issued in counterpart Japanese Application No. 2014-123270, with English machine translation. (3 pages).
(Continued)

*Primary Examiner* — Su C Kim
(74) *Attorney, Agent, or Firm* — Westerman, Hattori, Daniels & Adrian, LLP

(57) ABSTRACT

An optical sensor is installed in a device, and includes a light-emitting element, and a light-receiving element for receiving light emitted from the light-emitting element and traveling through a space. The optical sensor detects an object present in the space, based on a change of the light impinging upon the object. A first optical waveguide is connected to the light-emitting element so as to be capable of light propagation. The first optical waveguide has a front end portion serving as a light exit portion for exiting light emitted from the light-emitting element. A second optical waveguide is connected to the light-receiving element so as (Continued)

to be capable of light propagation. The second optical waveguide has a front end portion serving as a light entrance portion for receiving light exiting from the light exit portion of the first optical waveguide and traveling through the space.

2 Claims, 6 Drawing Sheets

(51) Int. Cl.
*H01L 33/50* (2010.01)
*G02B 6/00* (2006.01)
*G02B 6/12* (2006.01)
*H01L 25/16* (2006.01)
*H01L 31/16* (2006.01)

(52) U.S. Cl.
CPC ........ *H01L 31/02322* (2013.01); *H01L 31/16* (2013.01); *H01L 33/507* (2013.01)

(56) References Cited

U.S. PATENT DOCUMENTS

| | | | | |
|---|---|---|---|---|
| 5,999,670 | A * | 12/1999 | Yoshimura | G02B 6/1221 385/123 |
| 8,715,542 | B2 * | 5/2014 | Yamamoto | B29D 11/00663 264/1.1 |
| 2003/0034491 | A1 * | 2/2003 | Lempkowski | H01L 21/8221 257/55 |
| 2006/0002651 | A1 * | 1/2006 | Shimizu | B29D 11/00663 385/14 |
| 2009/0289266 | A1 | 11/2009 | Lee et al. | |
| 2010/0012850 | A1 * | 1/2010 | Miura | A61B 5/0059 250/372 |

FOREIGN PATENT DOCUMENTS

| | | |
|---|---|---|
| JP | 3-200105 A | 9/1991 |
| JP | 6-177419 A | 6/1994 |
| JP | 2001-24213 A | 1/2001 |
| JP | 2001-308372 A | 11/2001 |
| JP | 2003-222761 A | 8/2003 |
| JP | 2005-37533 A | 2/2005 |
| JP | 2005-43638 A | 2/2005 |
| JP | 2005-64140 A | 3/2005 |
| JP | 2006-5141 A | 1/2006 |
| JP | 2007-171488 A | 7/2007 |
| JP | 2008-20509 A | 1/2008 |
| JP | 2008-20719 A | 1/2008 |
| JP | 2011-96834 A | 5/2011 |

OTHER PUBLICATIONS

International Search Report dated Jul. 21, 2015, issued in counterpart International Application No. PCT/JP2015/065866 (2 pages).
Office Action dated Nov. 7, 2017, issued in counterpart Japanese Application No. 2014-123270, with English translation. (6 pages).
Office Action dated Aug. 2, 2017, issued in counterpart Chinese Application No. 201580031976.8, with English translation. (13 pages).
Notification of Transmittal of Translation of the International Preliminary Report on Patentability (Form PCT/IB/338) issued in counterpart International Application No. PCT/JP2015/065866 dated Dec. 29, 2016 with Form PCT/IB/373 and PCT/ISA/237. (6 pages).
Decision of Refusal dated Mar. 27, 2018, issued in counterpart Japanese Application No. 2014-123270, with English translation. (6 pages).
Office Action dated Sep. 30, 2018, issued in counterpart to Chinese Application No. 201580031976.8, with English translation (10 pages).
Office Action with Search Report dated Mar. 12, 2019, issued in counterpart TW Application No. 104117799, with English translation. (7 pages).
Office Action and Search Report dated Aug. 17, 2018, issued in counterpart Taiwanese Application No. 104117799, with English translation. (p. 6).

* cited by examiner

OPTICAL SENSOR

TECHNICAL FIELD

The present invention relates to an optical sensor for optically detecting the presence or absence of an object, the state of an object, and the like.

BACKGROUND ART

An optical sensor which optically detects the presence or absence of an object, the state of an object, and the like through the use of light intercepted or reflected, for example, by the object. An example of such an optical sensor includes a photointerrupter which detects the presence or absence of an object, based on the interception of light (see PTL 1, for example). As shown in FIG. 12, this photointerrupter includes a light-emitting element 3 and a light-receiving element 4 which are opposed to each other, with a space S therebetween. Light emitted from the light-emitting element 3 passes through the space S and is received directly by the light-receiving element 4. When an object that is an object M to be detected is present in the space S, light emitted from the light-emitting element 3 is intercepted by the object, and the light-receiving element 4 senses the interception of light, whereby the photo interrupter detects the presence of the object. Such a photointerrupter is installed, for example, in a sheet feeder of a printer, and is configured to detect the presence or absence of a sheet in the sheet feeder.

Another example of the optical sensor includes a proximity sensor which detects the presence or absence of an object, based on the reflection of light (see PTL 2, for example). As shown in FIG. 13, this proximity sensor includes the light-emitting element 3 and the light-receiving element 4 which are oriented toward the same side (upward as seen in FIG. 13). When an object that is the object M to be detected is present at a predetermined position (distance) in the space S on the side toward which the light-emitting element 3 and the light-receiving element 4 are oriented, light emitted from the light-emitting element 3 is reflected from the object, and the reflected light is received directly by the light-receiving element 4. When the object is absent at that position, the light emitted from the light-emitting element 3 is not reflected from the object or the reflected light, if any, is not received by the light-receiving element 4. In this manner, the proximity sensor is configured to detect the presence or absence of the object in the direction of light emission from the light-emitting element 3 (an upward direction as seen in FIG. 13), based on whether the reflected light is received by the light-receiving element 4 or not. Such a proximity sensor is installed, for example, in a cellular mobile phone, and is configured to detect the presence of a face (ear) near the cellular mobile phone during a phone conversation. Thus, a display is light-controlled on a display screen of the cellular mobile phone, so that the lifetime of a battery in the cellular mobile phone is increased.

RELATED ART DOCUMENT

Patent Document

PTL 1: JP-A-2005-64140
PTL 2: JP-A-2006-5141

SUMMARY OF INVENTION

There has been a demand for reduction in thickness of devices including the printer, the cellular mobile phone and the like. However, when the light-emitting element 3 and the light-receiving element 4 are directly used for the emission and reception of light in the optical sensor such as the photointerrupter, it is impossible to sufficiently meet the demand for further reduction in thickness because of the size of the light-emitting element 3 and the light-receiving element 4 themselves. In addition, the aforementioned elements 3 and 4 are mounted on an electrical substrate (not shown). The electrical substrate also becomes an impediment to the reduction in thickness. Further, the light-emitting element 3 and the light-receiving element 4 are generally used as the optical sensor such as the photointerrupter while being fixed by fixing members 51 and 52 such as cases together with the electrical substrate. Thus, the whole size is further increased by the size of the fixing members 51 and 52. Each of the elements 3 and 4 has the following dimensions: a width W0 of not less than 0.3 mm and a thickness T0 of not less than 1.0 mm, for example, inclusive of the electrical substrate on which the elements 3 and 4 are mounted. The dimensions of the fixing member 51 shown in FIG. 12 are as follows: parts for fixing the elements 3 and 4 together with the electrical substrate have a width W1 of not less than 0.53 mm and a thickness T1 of not less than 1.6 mm. The dimensions of the fixing member 52 shown in FIG. 13 are as follows: parts for fixing the elements 3 and 4 together with the electrical substrate have a width W2 of not less than 3.05 mm and a thickness T2 of not less than 1.0 mm. Further reduction in thickness has been desired.

In view of the foregoing, it is therefore an object of the present invention to provide an optical sensor in which a reduction in thickness of a light-emitting and -receiving part is achieved.

To accomplish the aforementioned object, a first configuration of an optical sensor according to the present invention comprises: a light-emitting element; a linear first optical waveguide; a light-receiving element; and a linear second optical waveguide, the linear first optical waveguide being connected to the light-emitting element so as to be capable of light propagation, the first optical waveguide having a front end portion serving as a light exit portion for exiting light emitted from the light-emitting element, the linear second optical waveguide being connected to the light-receiving element so as to be capable of light propagation, the second optical waveguide having a front end portion serving as a light entrance portion for receiving light exiting from the light exit portion of the first optical waveguide and traveling through a space, the light exit portion of the first optical waveguide having a smaller thickness than the light-emitting element, the light entrance portion of the second optical waveguide having a smaller thickness than that of the light-receiving element, the optical sensor being installed in a device and detecting an object to be detected present in the space, based on a change of the light impinging upon the object.

A second configuration of an optical sensor according to the present invention comprises: a light-emitting element; a first optical waveguide comprising a linear portion and a curved portion; a light-receiving element; and a second optical waveguide comprising a linear portion and a curved portion, the first optical waveguide being connected to the light-emitting element so as to be capable of light propagation, the first optical waveguide having a front end portion serving as a light exit portion for exiting light emitted from the light-emitting element, the second optical waveguide being connected to the light-receiving element so as to be capable of light propagation, the second optical waveguide having a front end portion serving as a light entrance portion for receiving light exiting from the light exit portion of the first optical waveguide and traveling through a space, the light exit portion of the first optical waveguide having a smaller thickness than the light-emitting element, the light entrance portion of the second optical waveguide having a smaller thickness than the light-receiving element, the optical sensor being installed in a device and detecting an object to be detected present in the space, based on a change of the light impinging upon the object.

The term "change of light" as used in the present invention means any one of the interception, transmission and reflection of light.

In the first configuration of the optical sensor according to the present invention, light is not transferred between the light-emitting and light-receiving elements, but is transferred using the linear optical waveguides instead, so that the reduction in thickness of the light-emitting and -receiving part is achieved. Specifically, the front end portion of the linear first optical waveguide connected to the light-emitting element is formed as the light exit portion, and the front end portion of the linear second optical waveguide connected to the light-receiving element is formed as the light entrance portion. Since the optical waveguides can be smaller in thickness, the reduction in thickness of the light-emitting and -receiving part (the light exit portion of the first optical waveguide and the light entrance portion of the second optical waveguide) is achieved, as compared with the conventional light-emitting and -receiving part (the light-emitting element and the light-receiving element). In the first configuration of the optical sensor according to the present invention, the light-emitting element is connected to the first optical waveguide extending from the light-emitting and -receiving part, and the light-receiving element is connected to the second optical waveguide extending from the light-emitting and -receiving part. Thus, the light-emitting element and the light-receiving element may be disposed in a location where no influence is exerted on the reduction in thickness of the device. Therefore, the device in which the optical sensor according to the present invention is installed is smaller in thickness. The second configuration of the optical sensor according to the present invention has the similar features as recited above.

In particular, the optical sensor further comprises a fixing member fixing the light exit portion of the first optical waveguide and the light entrance portion of the second optical waveguide such that a light exit surface of the first optical waveguide and a light entrance surface of the second optical waveguide are opposed to each other, with the space therebetween, wherein the light-emitting element and the light-receiving element are disposed in a spaced apart relationship to the fixing member. In such a case, part of the fixing member serves as the light-emitting and -receiving part (the light exit portion of the first optical waveguide and the light entrance portion of the second optical waveguide). The thickness of the fixing member can be smaller in corresponding relation to the thickness of the light exit portion of the first optical waveguide and the thickness of the light entrance portion of the second optical waveguide. This achieves the reduction in thickness of the light-emitting and -receiving part. The light-emitting and -receiving part is installed in the device by installing the fixing member in the device. This facilitates the installation. The light-emitting element and the light-receiving element are disposed in spaced apart relation to the fixing member. This allows the light-emitting element and the light-receiving element to be easily disposed in a location where no influence is exerted on the reduction in thickness of the device.

Also, the optical sensor further comprises a fixing member fixing the light exit portion of the first optical waveguide and the light entrance portion of the second optical waveguide such that a light exit surface of the first optical waveguide and a light entrance surface of the second optical waveguide are both oriented toward the same side, wherein the light-emitting element and the light-receiving element are disposed in a spaced apart relationship to the fixing member. In such a case, the fixing member similarly serves as the light-emitting and -receiving part (the light exit portion of the first optical waveguide and the light entrance portion of the second optical waveguide). The thickness of the fixing member can be smaller in corresponding relation to the thickness of the light exit portion of the first optical waveguide and the thickness of the light entrance portion of the second optical waveguide. This achieves the reduction in thickness of the light-emitting and -receiving part. The light-emitting and -receiving part is installed in the device by installing the fixing member in the device. This facilitates the installation. The light-emitting element and the light-receiving element are disposed in spaced apart relation to the fixing member. This allows the light-emitting element and the light-receiving element to be easily disposed in a location where no influence is exerted on the reduction in thickness of the device.

DESCRIPTION OF EMBODIMENTS

Next, embodiments according to the present invention will now be described in detail with reference to the drawings.

Figure 1A:
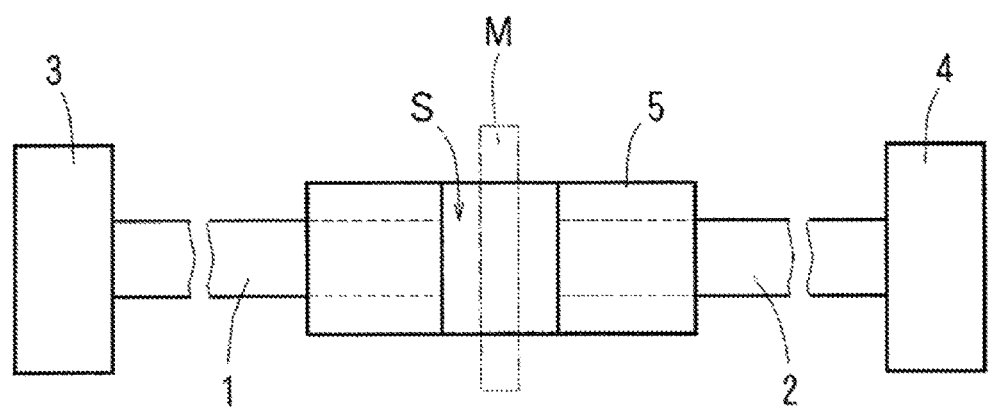
FIG. 1A is a schematic plan view of an optical sensor according to a first embodiment of the present invention.
Figure 1B:
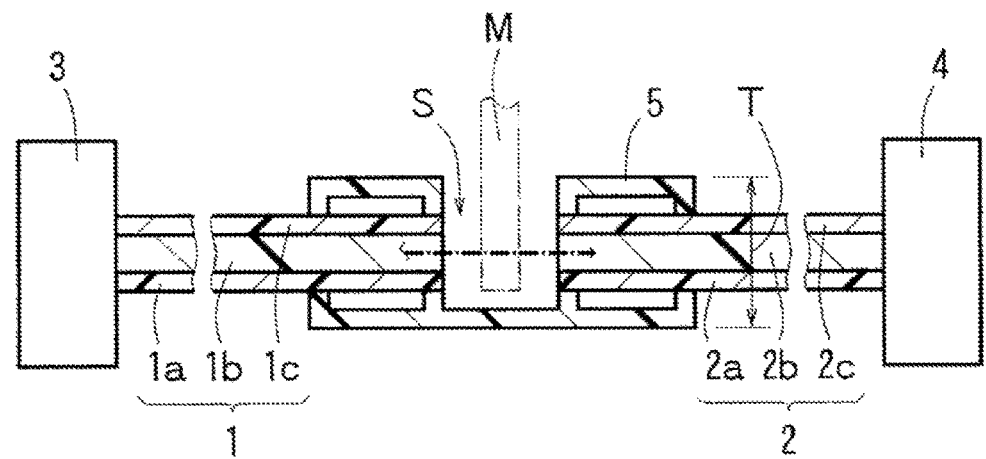
FIG. 1B is a schematic vertical sectional view thereof.

FIG. 1A is a plan view of an optical sensor according to a first embodiment of the present invention, and FIG. 1B is a vertical sectional view thereof. The optical sensor according to this embodiment includes: a light-emitting element 3 mounted on a first electrical substrate (not shown); a linear first optical waveguide 1 including a first end surface connected to the light-emitting element 3 so as to be capable of light propagation; a light-receiving element 4 mounted on a second electrical substrate (not shown); a linear second optical waveguide 2 including a first end surface connected to the light-receiving element 4 so as to be capable of light propagation; and a fixing member 5 for fixing a second end portion (front end portion) of the first optical waveguide 1 and a second end portion (front end portion) of the second optical waveguide 2 while a second end surface (front end surface) of the first optical waveguide 1 and a second end surface (front end surface) of the second optical waveguide 2 are opposed to each other, with a space S therebetween. Light emitted from the light-emitting element 3 passes through a core (optical path) 1b of the first optical waveguide 1 and exits from the front end surface of the first optical waveguide 1. Then, the light travels through the space S, and enters the front end surface of a core 2b of the second optical waveguide 2. Thereafter, the light passes through the core 2b, and is received by the light-receiving element 4 (with reference to a dash-and-dot arrow in the figure). A first end portion (where the light-emitting element 3 is connected) of the first optical waveguide 1 and a first end portion (where the light-receiving element 4 is connected) of the second optical waveguide 2 protrude out of the fixing member 5. The light-emitting element 3 and the light-receiving element 4 are disposed in a spaced apart relationship to the fixing member 5. In this embodiment, the first optical waveguide 1 has a thickness less than the sum of the thicknesses of the light-emitting element 3 and the first electrical substrate, and the second optical waveguide 2 has a thickness less than the sum of the thicknesses of the light-receiving element 4 and the second electrical substrate.

More specifically, the linear first and second optical waveguides 1 and 2 in this embodiment are configured such that the single cores 1b and 2b serving as the optical path are formed on surfaces of under cladding layers 1a and 2a, respectively, and such that over cladding layers 1c and 2c are formed on the surfaces of the under cladding layers 1a and 2a so as to cover the cores 1b and 2b, respectively. Such first and second optical waveguides 1 and 2 are flexible. The thicknesses of the respective layers are as follows: the under cladding layers 1a and 2a have a thickness in the range of 1 to 50 μm; the cores 1b and 2b have a thickness in the range of 1 to 100 μm; and the over cladding layers 1c and 2c have a thickness in the range of 1 to 50 μm (thickness as measured from the upper surfaces of the cores 1b and 2b), for example.

The fixing member 5 causes the front end surface (light exit surface) of the core 1b of the first optical waveguide 1 and the front end surface (light entrance surface) of the core 2b of the second optical waveguide 2 to be opposed to each other, with the space S therebetween, and fixes these front end surfaces so as to be capable of light propagation therebetween through the space S. The space S is an area through which an object that is an object M to be detected such as a sheet passes. That is, the fixing member 5 serves as a light-emitting and -receiving part (the light exit surface of the first optical waveguide 1 and the light entrance surface of the second optical waveguide 2). The thickness of the fixing member 5 can be smaller in corresponding relation to the thickness of the front end portion (light exit portion) of the first optical waveguide 1 and the thickness of the front end portion (light entrance portion) of the second optical waveguide 2. Thus, the reduction in thickness of the light-emitting and -receiving part is achieved. This also achieves the reduction in thickness of devices in which the optical sensor is installed.

For example, the first and second optical waveguides 1 and 2 having the front end portions with a thickness of 0.1 mm are produced in which the under cladding layers 1a and 2a have a thickness of 25 μm, the cores 1b and 2b have a thickness of 50 μm, and the over cladding layers 1c and 2c have a thickness of 25 μm (thickness as measured from the upper surfaces of the cores 1b and 2b). This allows the fixing member 5 to have a thickness T of 0.5 mm. The thickness T of the fixing member 5 is significantly smaller, as compared with the thickness T1 (not less than 1.6 mm) of the conventional fixing member 51 (with reference to FIG. 12) which fixes the light-emitting element 3 and the light-receiving element 4.

Further, the light-emitting element 3 is connected by the first optical waveguide 1, and the light-receiving element 4 is connected by the second optical waveguide 2. The light-emitting element 3 and the light-receiving element 4 protrude out of the fixing member (light-emitting and -receiving part) 5. Thus, the light-emitting element 3 and the light-receiving element 4 may be disposed in a spaced apart relationship to the fixing member 5 and in a location where no influence is exerted on the reduction in thickness of the devices. This also contributes to the reduction in thickness of the devices. It should be noted that the first electrical substrate and the second electrical substrate may be the same (integral) electrical substrate or different (separate) electrical substrates.

Examples of materials for the formation of the under cladding layers 1a and 2a, the cores 1b and 2b and the over cladding layers 1c and 2c include polymer resins such as epoxy, acrylic, polyamide, polyimide, polycarbonate, polymethyl methacrylate and polystyrene, and silicone resins. The linear first and second optical waveguides 1 and 2 may be produced by a manufacturing method depending on the materials. The cores 1b and 2b have a refractive index higher than the refractive indices of the under cladding layers 1a and 2a and the over cladding layers 1c and 2c. The adjustment of the refractive indices may be made, for example, by adjusting the selection of the types of the materials for the formation of the cores 1b and 2b, the under cladding layers 1a and 2a and the over cladding layers 1c and 2c, and the composition ratio thereof. Examples of a material for the formation of the fixing member 5 include photosensitive resins, thermosetting resins and metals. The fixing member 5 may be produced by a manufacturing method depending on the material.

Figure 2A:
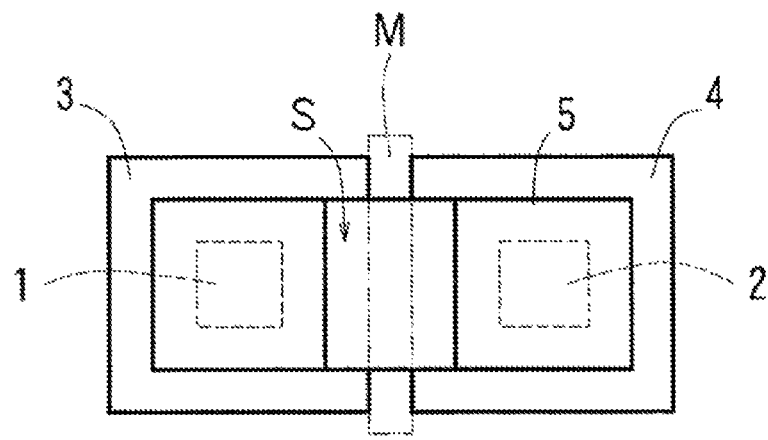
FIG. 2A is a schematic plan view of the optical sensor according to a second embodiment of the present invention.
Figure 2B:
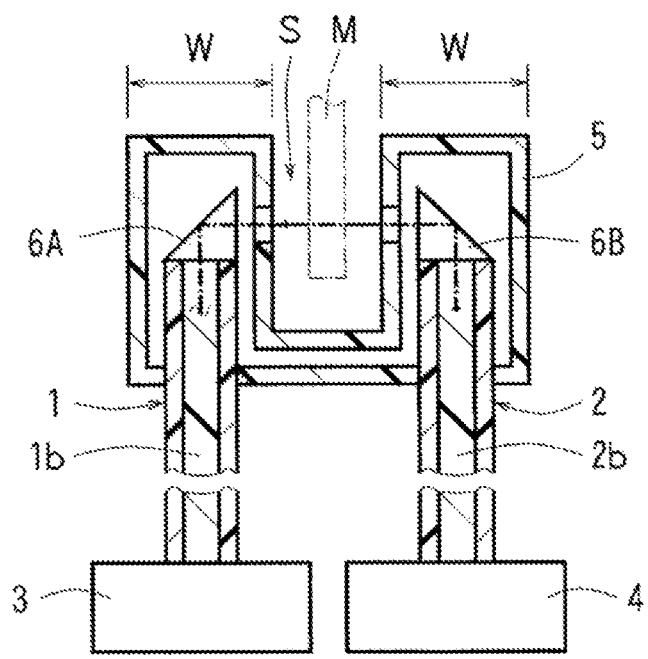
FIG. 2B is a schematic vertical sectional view thereof.

FIG. 2A is a plan view of the optical sensor according to a second embodiment of the present invention, and FIG. 2B is a vertical sectional view thereof. In the optical sensor according to this embodiment, optical path changing members 6A and 6B such as prisms for changing an optical path by 90 degrees are provided on the front end surfaces of the optical waveguides 1 and 2 to form the front end portions of the optical waveguides 1 and 2, respectively. The optical path changing members 6A and 6B may be provided by bonding to the respective optical waveguides 1 and 2 with an adhesive agent or by transfer molding with the respective optical waveguides 1 and 2 by one operation. The light exit surface of the optical path changing member (first optical path changing member) 6A of the light exit portion and the light entrance surface of the optical path changing member (second optical path changing member) 6B of the light entrance portion are opposed to each other, with the space S therebetween. The front end portions of the respective optical waveguides 1 and 2 extend in a direction (vertical direction as seen in FIG. 2B) orthogonal to a light beam propagating in the space S (with reference to a dash-and-dot arrow in the figure). The remaining parts of the second embodiment are similar to those of the first embodiment described above. Like reference numerals and characters are used in the second embodiment to designate parts similar to those of the first embodiment.

For example, when the first and second optical waveguides 1 and 2 have a thickness of 0.1 mm, this embodiment allows parts of the fixing member 5 which fix the front end portions of the first and second optical waveguides 1 and 2 to have a width W of 0.35 mm. The width W of these parts of the fixing member 5 is smaller, as compared with the width W1 (not less than 0.53 mm) of the parts of the conventional fixing member 51 (with reference to FIG. 12) which fix the light-emitting element 3 and the light-receiving element 4. This achieves the reduction in thickness of the devices in which the optical sensor is installed, as in the first embodiment.

Figure 3:
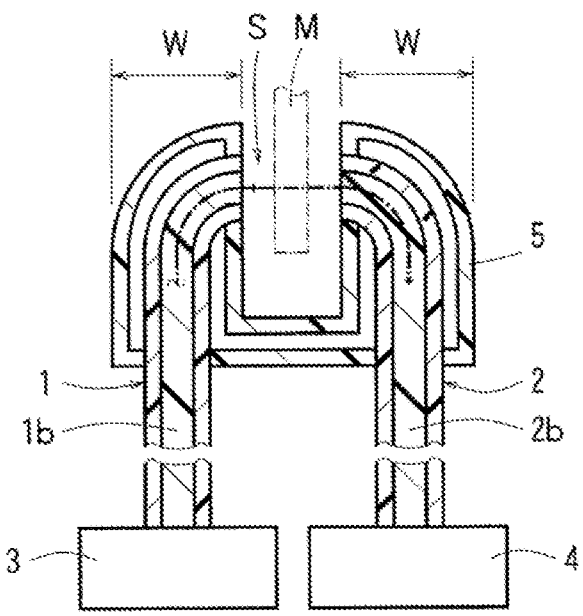
FIG. 3 is a schematic vertical sectional view of the optical sensor according to a third embodiment of the present invention.

FIG. 3 is a vertical sectional view of the optical sensor according to a third embodiment of the present invention. In the optical sensor according to this embodiment, the front ends of the respective optical waveguides 1 and 2 are bent through 90 degrees, so that the light exit surface of the light exit portion and the light entrance surface of the light entrance portion are opposed to each other, with the space S therebetween. Such optical waveguides 1 and 2 may be formed by transfer molding using a metal mold having such a bent shape by one operation. The front end portions of the respective optical waveguides 1 and 2 except the bent front ends extend in a direction (vertical direction as seen in FIG. 3) orthogonal to a light beam propagating in the space S (with reference to a dash-and-dot arrow in the figure). The remaining parts of the third embodiment are similar to those of the second embodiment described above. Like reference numerals and characters are used in the third embodiment to designate parts similar to those of the second embodiment.

For example, when the first and second optical waveguides 1 and 2 have a thickness of 0.1 mm and the front ends have a thickness of 0.15 mm including the bent portions, this embodiment allows parts of the fixing member 5 which fix the front end portions of the first and second optical waveguides 1 and 2 to have a width W of 0.4 mm. The width W of these parts of the fixing member 5 is smaller, as compared with the width W1 (not less than 0.53 mm) of the parts of the conventional fixing member 51 (with reference to FIG. 12) which fix the light-emitting element 3 and the light-receiving element 4. This achieves the reduction in thickness of the devices in which the optical sensor is installed, as in the second embodiment.

Figure 4:
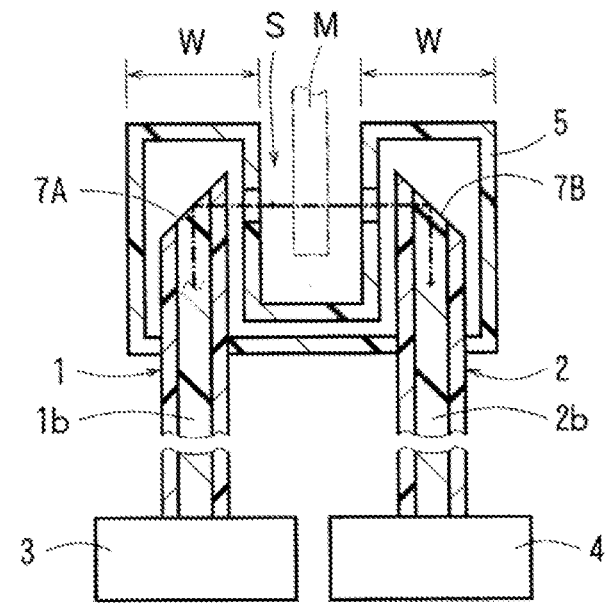
FIG. 4 is a schematic vertical sectional view of the optical sensor according to a fourth embodiment of the present invention.

FIG. 4 is a vertical sectional view of the optical sensor according to a fourth embodiment of the present invention. In the optical sensor according to this embodiment, optical path changing parts 7A and 7B for changing an optical path by 90 degrees are formed in the front end portions of the optical waveguides 1 and 2, respectively. These optical path changing parts 7A and 7B include inclined surfaces at 45 degrees with respect to the longitudinal direction (light propagation direction) of the optical waveguides 1 and 2, respectively. Parts of the inclined surfaces corresponding respectively to the cores 1*b* and 2*b* reflect light to change the optical path by 90 degrees (with reference to a dash-and-dot arrow in the figure). The inclined surfaces are formed by cutting the front end portions of the respective optical waveguides 1 and 2 by means of a cutting blade, laser beam machining and the like. The light exit surface which exits light subjected to the optical path change by the optical path changing part 7A of the first optical waveguide 1 and the light entrance surface of the second optical waveguide 2 which receives the light are opposed to each other, with the space S therebetween. The front end portions of the respective optical waveguides 1 and 2 extend in a direction (vertical direction as seen in FIG. 4) orthogonal to a light beam propagating in the space S. The remaining parts of the fourth embodiment are similar to those of the second embodiment described above and shown in FIGS. 2A and 2B. Like reference numerals and characters are used in the fourth embodiment to designate parts similar to those of the second embodiment.

For example, when the first and second optical waveguides 1 and 2 have a thickness of 0.1 mm as in the second embodiment, this embodiment allows parts of the fixing member 5 which fix the front end portions of the first and second optical waveguides 1 and 2 to have a width W of 0.35 mm. The width W of these parts of the fixing member 5 is smaller, as compared with the width W1 (not less than 0.53 mm) of the parts of the conventional fixing member 51 (with reference to FIG. 12). This achieves the reduction in thickness of the devices in which the optical sensor is installed, as in the second embodiment.

Figure 5:
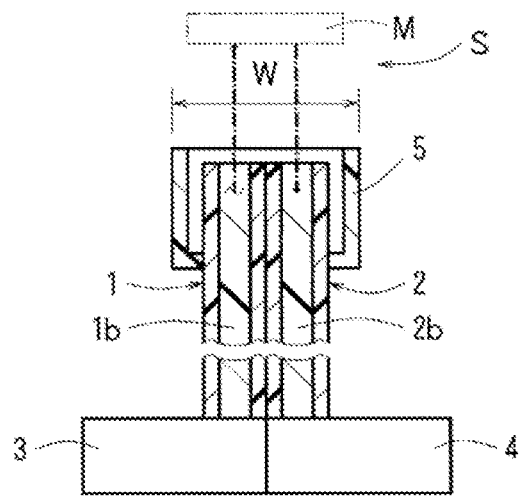
FIG. 5 is a schematic vertical sectional view of the optical sensor according to a fifth embodiment of the present invention.

FIG. 5 is a vertical sectional view of the optical sensor according to a fifth embodiment of the present invention. In the optical sensor according to this embodiment, the light exit portion (front end portion) of the first optical waveguide 1 and the light entrance portion (front end portion) of the second optical waveguide 2 are fixed by the fixing member 5 while the light exit surface (front end surface) of the first optical waveguide 1 and the light entrance surface (front end surface) of the second optical waveguide 2 are oriented toward the same side (upward as seen in FIG. 5). In this embodiment, the light exit portion and the light entrance portion (front end portions) are in contact with each other along the length of the optical waveguides 1 and 2. When an object that is the object M to be detected is present at a predetermined position (distance) in the space S on the side toward which the light exit surface is oriented, light emitted from the light-emitting element 3 passes through the core 1*b* of the first optical waveguide 1 and exits from the light exit surface (front end surface) of the first optical waveguide 1. Then, the light is reflected from the object, and the reflected light enters the light entrance surface (front end surface) of the core 2*b* of the second optical waveguide 2. Thereafter, the light passes through the core 2*b*, and is received by the light-receiving element 4 (with reference to dash-and-dot arrows in the figure). When the object is absent at that position, the light exiting from the light exit surface is not reflected from the object or the reflected light, if any, does not enter the light entrance surface. The remaining parts of the fifth embodiment are similar to those of the second embodiment described above and shown in FIGS. 2A and 2B. Like reference numerals and characters are used in the fifth embodiment to designate parts similar to those of the second embodiment.

For example, when the first and second optical waveguides 1 and 2 have a thickness of 0.1 mm, the front end portions of the first and second optical waveguides 1 and 2 which are in contact with each other have a width of 0.2 mm. Thus, this embodiment allows the fixing member 5 which fixes the front end portions of the first and second optical waveguides 1 and 2 to have a width W of 0.7 mm. The width W of the fixing member 5 is significantly smaller, as compared with the width W2 (not less than 3.05 mm) of the conventional fixing member 52 (with reference to FIG. 13) which fixes the light-emitting element 3 and the light-receiving element 4. This achieves the reduction in thickness of the devices in which the optical sensor is installed, as in the second embodiment.

Figure 6:
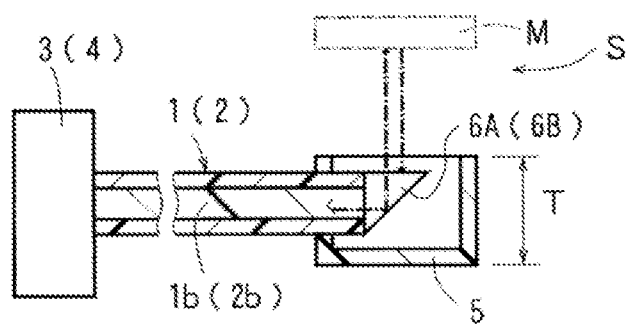
FIG. 6 is a schematic vertical sectional view of the optical sensor according to a sixth embodiment of the present invention.

FIG. 6 is a vertical sectional view of the optical sensor according to a sixth embodiment of the present invention. In the optical sensor according to this embodiment, the optical path changing members 6A and 6B such as prisms for changing an optical path by 90 degrees are provided on the front end surfaces of the optical waveguides 1 and 2 to form the front end portions of the optical waveguides 1 and 2, respectively. The aforementioned optical path changing members 6A and 6B are similar to those of the second embodiment shown in FIGS. 2A and 2B. The light exit surface of the optical path changing member (first optical path changing member) 6A of the light exit portion and the light entrance surface of the optical path changing member (second optical path changing member) 6B of the light entrance portion are oriented toward the same side (upward as seen in FIG. 6). The front end portions of the respective optical waveguides 1 and 2 extend in a direction (leftward as seen in FIG. 6) orthogonal to the direction in which the light exit surface is oriented. In FIG. 6, the first optical waveguide 1 and the second optical waveguide 2 are shown as coinciding with each other, and the light-emitting element 3 and the light-receiving element 4 are shown as coinciding with each other. Further, the first optical path changing member 6A and the second optical path changing member 6B are shown in FIG. 6 as coinciding with each other. The remaining parts of the sixth embodiment are similar to those of the fifth embodiment described above. Like reference numerals and characters are used in the sixth embodiment to designate parts similar to those of the fifth embodiment.

For example, when the first and second optical waveguides 1 and 2 have a thickness of 0.1 mm, this embodiment allows parts of the fixing member 5 which fix the front end portions of the first and second optical waveguides 1 and 2 to have a thickness T of 0.35 mm. The thickness T of these parts of the fixing member 5 is smaller, as compared with the thickness T2 (not less than 1.0 mm) of the conventional fixing member 52 (with reference to FIG. 13) which fix the light-emitting element 3 and the light-receiving element 4. This achieves the reduction in thickness of the devices in which the optical sensor is installed, as in the fifth embodiment.

Figure 7:
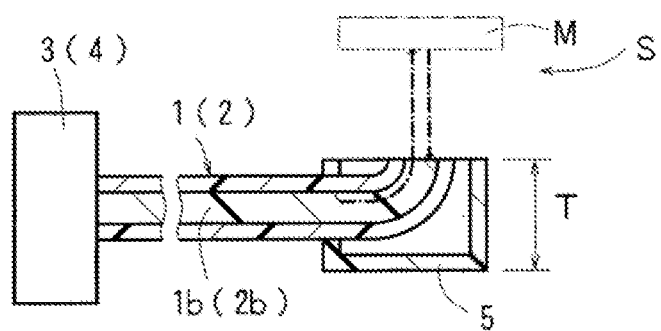
FIG. 7 is a schematic vertical sectional view of the optical sensor according to a seventh embodiment of the present invention.

FIG. 7 is a vertical sectional view of the optical sensor according to a seventh embodiment of the present invention. In the optical sensor according to this embodiment, the front ends of the respective optical waveguides 1 and 2 are bent through 90 degrees, so that the light exit surface of the light exit portion and the light entrance surface of the light entrance portion are oriented toward the same side (upward as seen in FIG. 7). Such optical waveguides 1 and 2 are provided in the same manner as in the third embodiment shown in FIG. 3. Parts of the front end portions of the respective optical waveguides 1 and 2 except the bent front ends extend in a direction (leftward as seen in FIG. 7) orthogonal to the direction in which the light exit surface is oriented. In FIG. 7, the first optical waveguide 1 and the second optical waveguide 2 are shown as coinciding with each other, and the light-emitting element 3 and the light-receiving element 4 are shown as coinciding with each other. The remaining parts of the seventh embodiment are similar to those of the sixth embodiment described above. Like reference numerals and characters are used in the seventh embodiment to designate parts similar to those of the sixth embodiment.

For example, when the first and second optical waveguides 1 and 2 have a thickness of 0.1 mm including the bent front ends, this embodiment allows parts of the fixing member 5 which fix the front end portions of the first and second optical waveguides 1 and 2 to have a thickness T of 0.4 mm. The thickness T of these parts of the fixing member 5 is smaller, as compared with the thickness T2 (not less than 1.0 mm) of the conventional fixing member 52 (with reference to FIG. 13) which fix the light-emitting element 3 and the light-receiving element 4. This achieves the reduction in thickness of the devices in which the optical sensor is installed, as in the sixth embodiment.

Figure 8:
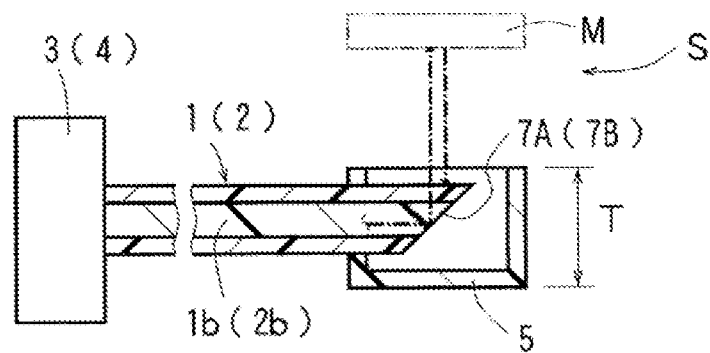
FIG. 8 is a schematic vertical sectional view of the optical sensor according to an eighth embodiment of the present invention.

FIG. 8 is a vertical sectional view of the optical sensor according to an eighth embodiment of the present invention. In the optical sensor according to this embodiment, the optical path changing parts 7A and 7B for changing an optical path by 90 degrees are formed in the front end portions of the optical waveguides 1 and 2, respectively. These optical path changing parts 7A and 7B are similar to those of the fourth embodiment shown in FIG. 4. The light exit surface which exits light subjected to the optical path change by the optical path changing part 7A of the first optical waveguide 1 and the light entrance surface of the second optical waveguide 2 which receives the reflected light are oriented toward the same side (upward as seen in FIG. 8). The front end portions of the respective optical waveguides 1 and 2 extend in a direction (leftward as seen in FIG. 8) orthogonal to the direction in which the light exit surface is oriented. In FIG. 8, the first optical waveguide 1 and the second optical waveguide 2 are shown as coinciding with each other, and the light-emitting element 3 and the light-receiving element 4 are shown as coinciding with each other. The remaining parts of the eighth embodiment are similar to those of the sixth embodiment described above and shown in FIG. 6. Like reference numerals and characters are used in the eighth embodiment to designate parts similar to those of the sixth embodiment.

For example, when the first and second optical waveguides 1 and 2 have a thickness of 0.1 mm as in the sixth embodiment, this embodiment allows parts of the fixing member 5 which fix the front end portions of the first and second optical waveguides 1 and 2 to have a thickness T of 0.35 mm. The thickness T of these parts of the fixing member 5 is smaller, as compared with the thickness T2 (not less than 1.0 mm) of the conventional fixing member 52 (with reference to FIG. 13). This achieves the reduction in thickness of the devices in which the optical sensor is installed, as in the sixth embodiment.

Figure 9:
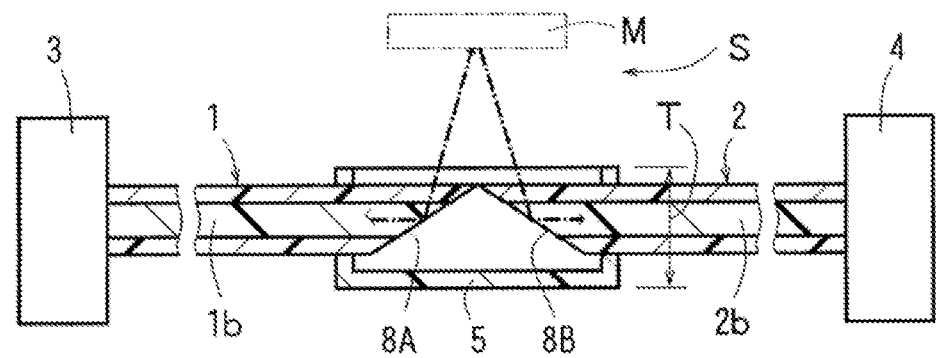
FIG. 9 is a schematic vertical sectional view of the optical sensor according to a ninth embodiment of the present invention.

FIG. 9 is a vertical sectional view of the optical sensor according to a ninth embodiment of the present invention. In the optical sensor according to this embodiment, optical path changing parts 8A and 8B for changing an optical path by an angle slightly greater than 90 degrees are formed in the front end portions of the optical waveguides 1 and 2, respectively. The front end portions of the respective optical waveguides 1 and 2 are fixed by the fixing member 5 while being held in abutting relation. The light exit surface which exits light subjected to the optical path change by the optical path changing part 8A of the first optical waveguide 1 and the light entrance surface of the second optical waveguide 2 which receives the reflected light are oriented toward the same side (upward as seen in FIG. 9). The front end portions of the respective optical waveguides 1 and 2 extend in a direction (the first optical waveguide 1 extends leftwardly and the second optical waveguide 2 extends rightwardly as seen in FIG. 9) orthogonal to the direction in which the light exit surface is oriented. The remaining parts of the ninth embodiment are similar to those of the sixth embodiment described above and shown in FIG. 6. Like reference numerals and characters are used in the ninth embodiment to designate parts similar to those of the sixth embodiment.

For example, when the first and second optical waveguides 1 and 2 have a thickness of 0.1 mm as in the sixth embodiment, this embodiment allows parts of the fixing member 5 which fix the front end portions of the first and second optical waveguides 1 and 2 to have a thickness T of 0.35 mm. The thickness T of these parts of the fixing member 5 is smaller, as compared with the thickness T2 (not less than 1.0 mm) of the conventional fixing member 52 (with reference to FIG. 13). This achieves the reduction in thickness of the devices in which the optical sensor is installed, as in the sixth embodiment.

Figure 10:
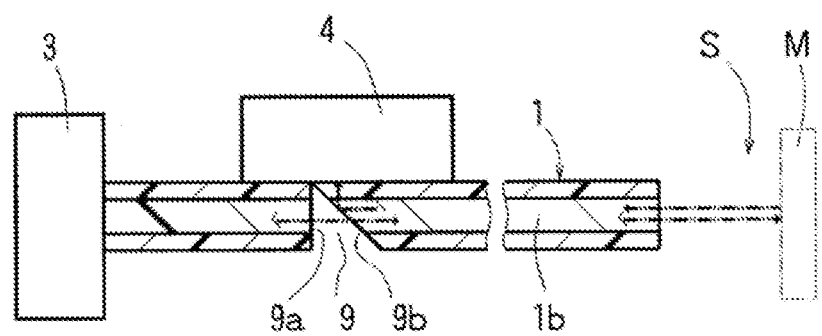
FIG. 10 is a schematic vertical sectional view of the optical sensor according to a tenth embodiment of the present invention.

FIG. 10 is a vertical sectional view of the optical sensor according to a tenth embodiment of the present invention. In the optical sensor according to this embodiment, the first optical waveguide 1 bears the function of the second optical waveguide 2, so that the single core 1b is used alone. Specifically, a longitudinally intermediate portion of the first optical waveguide 1 has a cut 9 formed therein. The cut 9 has a surface 9a orthogonal to the longitudinal direction (propagation direction of light from the light-emitting element 3) of the first optical waveguide 1, and an inclined surface 9b forward of the orthogonal surface 9a (in the propagation direction of light from the light-emitting element 3) and inclined at 45 degrees with respect to the longitudinal direction of the first optical waveguide 1. The light-receiving element 4 is connected to a portion (over the cut 9 as seen in FIG. 10) corresponding to the cut 9. Light from the light-emitting element 3 passes through the cut 9 and exits from the front end surface of the first optical waveguide 1. The light exiting from the front end surface is reflected from the object M to be detected. Thereafter, the reflected light enters the same front end surface of the first optical waveguide 1, and is subjected to a 90-degree optical path change by the inclined surface 9b. Then, the light is received by the light-receiving element 4 (with reference to dash-and-dot arrows in the figure). The fixing member 5 (with reference to FIG. 9) is not provided in this embodiment.

In this embodiment, the light-emitting and -receiving part is the front end surface of the first optical waveguide 1. Thus, for example, when the first optical waveguide 1 has a height (thickness) of 0.1 mm, the light-emitting and -receiving part has a height (thickness) of 0.1 mm. This height (thickness) is significantly smaller, as compared with the thickness T2 (not less than 1.0 mm) of the conventional fixing member 52 (with reference to FIG. 13) serving as the light-emitting and -receiving part. This achieves the reduction in thickness of the devices in which the optical sensor is installed, as in the fifth embodiment.

Figure 11:
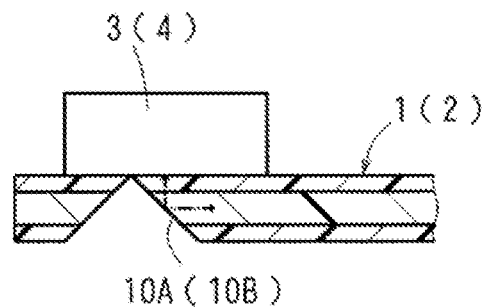
FIG. 11 is a schematic vertical sectional view of a modification of a connection configuration of a light-emitting element and a light-receiving element in the optical sensor.

In the first to tenth embodiments, the light-emitting element 3 is connected to the first end surface of the first optical waveguide 1, and the light-receiving element 4 is connected to the first end surface of the second optical waveguide 2 (except the connection of the light-receiving element 4 in the tenth embodiment). Alternatively, as shown in vertical sectional view in FIG. 11, optical path changing parts 10A and 10B for changing an optical path by 90 degrees may be formed in at least one of the optical waveguides 1 and 2, and the light-emitting element 3 and the light-receiving element 4 may be connected to portions corresponding to the optical path changing parts 10A and 10B. The optical path changing parts 10A and 10B are similar to the optical path changing parts 7A and 7B in the light exit portion and the light entrance portion according to the fourth embodiment shown in FIG. 4.

In the first to ninth embodiments, the fixing member 5 is used to fix the front end portions of the respective optical waveguides 1 and 2. However, the shape of the fixing member 5 may be other than those shown in the figures, and is determined, as appropriate, depending on the devices in which the fixing member 5 is installed. Further, the front end portions of the optical waveguides 1 and 2 may be fixed to the devices without the use of the fixing member 5. In the first to fourth embodiments, the size and shape of the space S are determined, as appropriate, depending on the size and shape of the object M to be detected because the object M to be detected passes through the space S defined between the light exit surface and the light entrance surface.

The optical sensor according to the first to tenth embodiments is used, for example, as a photointerrupter, an area sensor, a proximity sensor, a photoelectric sensor, an RGB sensor, an optical encoder, a vein authentication sensor, a blood flow sensor and the like.

Next, inventive examples of the present disclosure will be described in conjunction with conventional examples. It should be noted that the present disclosure is not limited to the inventive examples.

EXAMPLES

[Materials for Formation of Under Cladding Layer and Over Cladding Layer]

Materials for the formation of an under cladding layer and an over cladding layer were prepared by mixing 80 parts by weight of an aliphatic chain modified epoxy resin (EPICLON EXA-4816 available from DIC Corporation), 20 parts by weight of an aliphatic epoxy resin (EHPE3150 available from Daicel Corporation), 2 parts by weight of a photo-acid generator (SP170 available from ADEKA Corporation), and 40 parts by weight of ethyl lactate (a solvent available from Musashino Chemical Laboratory, Ltd.) together.

[Material for Formation of Core]

A material for the formation of a core was prepared by mixing 50 parts by weight of o-cresol novolac glycidyl ether (YDCN-700-10 available from Nippon Steel & Sumikin Chemical Co., Ltd.), 50 parts by weight of bisphenoxyethanolfluorene diglycidyl ether (OGSOL EG available from Osaka Gas Chemicals Co., Ltd.), 1 part by weight of a photo-acid generator (SP170 available from ADEKA Corporation), and 15 parts by weight of ethyl lactate (a solvent available from Musashino Chemical Laboratory, Ltd.) together.

[First and Second Optical Waveguides]

Using the aforementioned materials, a single strip-shaped core (with a width of 50 µm) having a thickness of 50 µm was formed in the middle of a surface of a strip-shaped under cladding layer (with a width of 0.1 mm) having a thickness of 25 µm so as to extend in the longitudinal direction of the under cladding layer, and an over cladding layer (with a thickness of 25 µm as measured from the upper surface of the core, and a width of 0.1 mm) was formed on the surface of the under cladding layer so as to cover the core. This provided linear first and second optical waveguides having a thickness of 0.1 mm and a width of 0.1 mm.

[Light-Emitting Element and Light-Receiving Element]

ULM850-05-TT-C0101G available from ULM Photonics GmbH was prepared as a light-emitting element, and mounted on a first electrical substrate. The light-emitting element, including the first electrical substrate, had the following dimensions: a width W0 of 1.0 mm, and a thickness T0 of 0.3 mm. KPDG006HA1 available from Kyosemi Corporation was prepared as a light-receiving element, and mounted on a second electrical substrate. The light-receiving element, including the second electrical substrate, had the following dimensions: a width W0 of 1.0 mm, and a thickness T0 of 0.35 mm (with reference to FIGS. 12 and 13).

Inventive Example 1

[Optical Sensor]

An optical sensor shown in FIGS. 1A and 1B was produced using the first and second optical waveguides, the light-emitting element and the light-receiving element. A fixing member was made of a synthetic resin.

Inventive Example 2

[Optical Sensor]

An optical sensor shown in FIG. 4 was produced in the same manner as in Inventive Example 1.

Inventive Example 3

[Optical Sensor]

An optical sensor shown in FIG. 5 was produced in the same manner as in Inventive Example 1.

Inventive Example 4

[Optical Sensor]

An optical sensor shown in FIG. 8 was produced in the same manner as in Inventive Example 1.

Conventional Example 1

Figure 12:
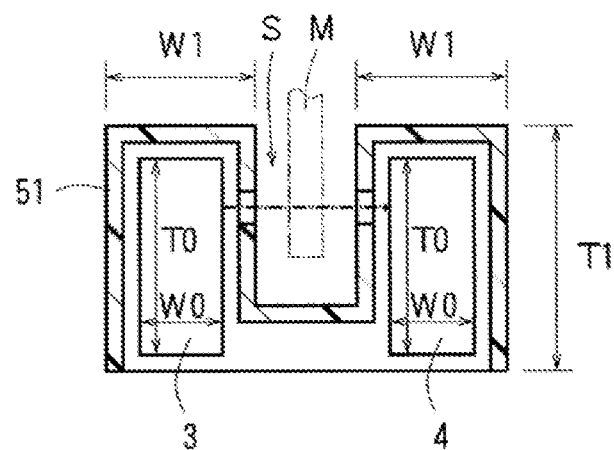
FIG. 12 is a schematic sectional view of a conventional optical sensor.

A conventional optical sensor show in FIG. 12 was prepared.

Conventional Example 2

Figure 13:
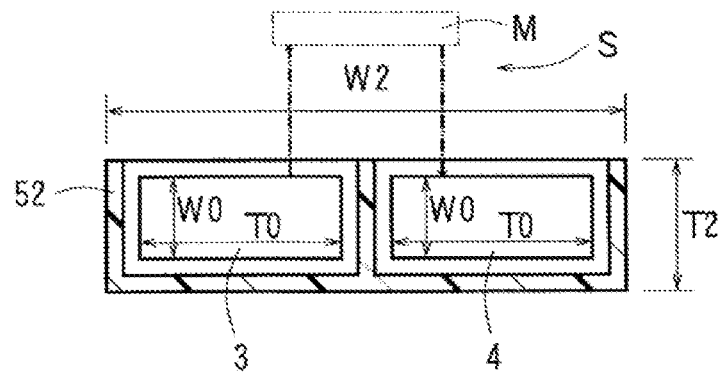
FIG. 13 is a schematic sectional view of another conventional optical sensor.

A conventional optical sensor show in FIG. 13 was prepared.

[Measurement of Dimensions of Light-Emitting and -Receiving Part in Optical Sensor]

Dimensions of the fixing member in each of the optical sensors in Inventive Examples 1 to 4 and Conventional Examples 1 and 2 described above were measured. As a result, the thickness T of the fixing member in Inventive Example 1 was 0.5 mm; the width W of part of the fixing member which fixes a front end portion of each of the optical waveguides in Inventive Example 2 was 0.35 mm; the width W of part of the fixing member which fixes a front end portion of each of the optical waveguides in Inventive Example 3 was 0.7 mm; and the thickness T of part of the fixing member which fixes a front end portion of each of the optical waveguides in Inventive Example 4 was 0.35 mm.

The width W1 of part of the fixing member which fixes each of the elements in Conventional Example 1 was 0.53 mm; the thickness T1 thereof was 1.6 mm; the width W2 of part of the fixing member which fixes each of the elements in Conventional Example 2 was 3.05 mm; and the thickness T2 thereof was 1.0 mm.

It is found from the results of the measurement of the dimensions that the thicknesses T of the fixing members in Inventive Examples 1 and 4 are less than the thicknesses T1 and T2 of the fixing members in Conventional Examples 1 and 2, that the width W of the predetermined part of the fixing member in Inventive Example 2 is less than the width W1 of the predetermined part of the fixing member in Conventional Example 1, and that the width W of the predetermined part of the fixing member in Inventive Example 3 is less than the width W2 of the predetermined part of the fixing member in Conventional Example 2. The aforementioned parts of the fixing members serve as a light-emitting and -receiving part. It is therefore found that Inventive Examples 1 to 4 achieve a reduction in thickness of the light-emitting and -receiving part, as compared with Conventional Examples 1 and 2.

It has already been verified that light is properly received and emitted in each of the optical sensors in Inventive Examples 1 to 4.

Although specific forms in the present disclosure have been described in the aforementioned examples, the aforementioned examples should be considered as merely illustrative and not restrictive. It is contemplated that various modifications evident to those skilled in the art could be made without departing from the scope of the present disclosure.

The optical sensor according to the present disclosure is installed in devices and is applicable to the optical detection of the presence or absence of an object, the state of an object, and the like.

REFERENCE SIGNS LIST

M Object to be detected
S Space
1 First optical waveguide
2 Second optical waveguide
3 Light-emitting element
4 Light-receiving element

The invention claimed is:

1. An optical sensor comprising:
a light-emitting element;
a linear optical waveguide; and
a light-receiving element;
wherein the linear optical waveguide is connected to the light-emitting element so as to be capable of light propagation,
wherein a longitudinally intermediate portion of the optical waveguide has a cut formed therein,
wherein the cut has a surface orthogonal to the longitudinal direction of the optical waveguide, and has an inclined surface in a propagation direction of light from the light-emitting element and inclined at 45 degrees with respect to the longitudinal direction of the optical waveguide,
wherein the light-receiving element is connected to a portion of the optical waveguide corresponding to the cut so as to be capable of light propagation,
wherein the optical waveguide has a front end portion serving as a light exit portion for exiting light emitted from the light-emitting element, wherein the front end portion serves as a light entrance portion for receiving light exiting from the light exit portion of the optical waveguide and reflected from an object to be detected present in a space, wherein the light exit portion is reduced in thickness than that of the light-emitting element, wherein the light entrance portion is reduced in thickness than that of the light-receiving element, wherein light from the light-emitting element passes through the cut and exits from the front end surface of the optical waveguide, wherein light entering the front end surface is subjected to an optical path change by the inclined surface and is received by the light-receiving element, wherein the optical sensor is configured to detect an object to be detected present in the space, based on a change of the light impinging upon the object, and wherein the surface orthogonal to the longitudinal direction of the optical waveguide is nearer to the light-emitting element than the inclined surface, in the propagation direction of the light-emitting element.

2. An optical sensor comprising:

a light-emitting element;

a linear optical waveguide; and a light-receiving element;

wherein the linear optical waveguide is connected to the light-emitting element so as to be capable of light propagation, wherein a longitudinally intermediate portion of the optical waveguide has a cut formed therein, wherein the cut has a surface orthogonal to the longitudinal direction of the optical waveguide, and has an inclined surface in a propagation direction of light from the light-emitting element and inclined at 45 degrees with respect to the longitudinal direction of the optical waveguide, wherein the light-receiving element is connected to a portion of the optical waveguide corresponding to the cut so as to be capable of light propagation, wherein the optical waveguide has a front end portion serving as a light exit portion for exiting light emitted from the light-emitting element, wherein the front end portion serves as a light entrance portion for receiving light exiting from the light exit portion of the optical waveguide and reflected from an object to be detected present in a space, wherein the light exit portion is reduced in thickness than that of the light-emitting element, wherein the light entrance portion is reduced in thickness than that of the light-receiving element, wherein light from the light-emitting element passes through the cut and exits from the front end surface of the optical waveguide, wherein light entering the front end surface is subjected to an optical path change by the inclined surface and is received by the light-receiving element, wherein the optical sensor is configured to detect an object to be detected present in the space, based on a change of the light impinging upon the object, and wherein the cut passes through the entirety of a core of the optical waveguide, in a thickness direction of the optical waveguide.

* * * * *